United States Patent [19]

Laurent et al.

[11] Patent Number: 5,728,224
[45] Date of Patent: Mar. 17, 1998

[54] APPARATUS AND METHOD FOR MANUFACTURING A PACKAGING MATERIAL USING GASEOUS PHASE ATMOSPHERIC PHOTO CHEMICAL VAPOR DEPOSITION TO APPLY A BARRIER LAYER TO A MOVING WEB SUBSTRATE

[75] Inventors: Jacques A. Laurent, Libertyville; Wolfgang Decker, Wheeling, both of Ill.

[73] Assignee: Tetra Laval Holdings & Finance S.A., Pully, Switzerland

[21] Appl. No.: 527,414

[22] Filed: Sep. 13, 1995

[51] Int. Cl.⁶ .................. C23C 16/00; C23C 16/48
[52] U.S. Cl. .............. 118/718; 118/722; 118/501; 427/582; 427/583; 427/255.5; 53/140
[58] Field of Search ................ 118/718, 722, 118/50.1; 427/582, 583, 255.5; 53/140, 131.5, 561

[56] References Cited

U.S. PATENT DOCUMENTS

| | | | |
|---|---|---|---|
| 2,841,477 | 7/1958 | Hall | 41/42 |
| 3,114,652 | 12/1963 | Schetky | 117/93.1 |
| 3,188,230 | 6/1965 | Bakish et al. | 117/107.1 |
| 3,190,262 | 6/1965 | Bakish et al. | 118/718 |
| 3,200,018 | 8/1965 | Grossman | 148/175 |
| 3,620,827 | 11/1971 | Guillaume | 117/200 |
| 3,652,331 | 3/1972 | Yamazaki | 117/201 |
| 3,832,827 | 9/1974 | Lemelson | 53/111 R |
| 4,203,387 | 5/1980 | McMullen et al. | 118/715 |
| 4,265,932 | 5/1981 | Peters et al. | 427/53.1 |
| 4,276,135 | 6/1981 | Sato et al. | 204/159.13 |
| 4,340,617 | 7/1982 | Deutsch et al. | 427/53.1 |
| 4,371,587 | 2/1983 | Peters | 428/446 |
| 4,419,385 | 12/1983 | Peters | 427/99 |
| 4,454,835 | 6/1984 | Walsh et al. | 118/712 |
| 4,466,992 | 8/1984 | Dreiling | 427/39 |
| 4,495,218 | 1/1985 | Azuma et al. | 427/53.1 |
| 4,516,527 | 5/1985 | Sugioka | 118/723 |
| 4,525,381 | 6/1985 | Tanaka et al. | 427/54.1 |
| 4,540,466 | 9/1985 | Nishizawa | 156/643 |
| 4,543,271 | 9/1985 | Peters . | |
| 4,554,180 | 11/1985 | Hirooka | 427/248.1 |
| 4,588,610 | 5/1986 | Yamazaki | 427/54.1 |
| 4,590,091 | 5/1986 | Rogers, Jr. et al. | 427/53.1 |
| 4,597,986 | 7/1986 | Scapple et al. | 427/53.1 |
| 4,615,294 | 10/1986 | Scapple et al. | 118/50.1 |
| 4,623,426 | 11/1986 | Peters | 156/614 |
| 4,628,862 | 12/1986 | Kamiya | 118/724 |
| 4,652,463 | 3/1987 | Peters | 427/53.1 |
| 4,654,226 | 3/1987 | Jackson et al. | 427/54.1 |
| 4,694,777 | 9/1987 | Roche | 118/725 |
| 4,702,936 | 10/1987 | Maeda et al. | 427/54.1 |
| 4,726,963 | 2/1988 | Ishihara et al. | 427/39 |
| 4,734,317 | 3/1988 | Bothe et al. | 428/215 |
| 4,735,832 | 4/1988 | Ichikawa et al. | 428/35 |
| 4,753,818 | 6/1988 | Rogers, Jr. | 427/54.1 |
| 4,761,327 | 8/1988 | Hamano et al. | 428/220 |
| 4,841,908 | 6/1989 | Jacobson et al. | 118/718 |
| 4,898,786 | 2/1990 | Swofford | 428/480 |
| 4,911,984 | 3/1990 | Parker | 428/428 |
| 4,939,035 | 7/1990 | Swofford | 428/341 |
| 4,954,396 | 9/1990 | Swofford et al. | 428/340 |
| 5,070,811 | 12/1991 | Feuerstein et al. | 118/623 |
| 5,082,738 | 1/1992 | Swofford | 428/437 |
| 5,085,904 | 2/1992 | Deak et al. | 428/35.7 |
| 5,096,738 | 3/1992 | Wyman | 427/44 |
| 5,100,720 | 3/1992 | Sawada et al. | 428/215 |
| 5,122,410 | 6/1992 | Löfgren et al. | 428/216 |

(List continued on next page.)

OTHER PUBLICATIONS

United States Patent Serial No. 08/547,414 by Laurent et al., filed Sep. 13, 1995.

*Primary Examiner*—Richard Bueker
*Assistant Examiner*—Jeffrie R. Lund
*Attorney, Agent, or Firm*—McAndrews, Held & Malloy, Ltd.; Michael A. Catania

[57] ABSTRACT

An apparatus and process are disclosed for depositing a barrier layer, such as an SiOx barrier layer, onto a moving web of substrate material in a continuous process at atmospheric pressure using a gaseous phase precursor and an oxidizer.

40 Claims, 8 Drawing Sheets

U.S. PATENT DOCUMENTS

| | | | |
|---|---|---|---|
| 5,209,972 | 5/1993 | Super et al. | 428/349 |
| 5,224,441 | 7/1993 | Felts et al. | 118/718 |
| 5,230,923 | 7/1993 | Hirokawa et al. | 427/248.1 |
| 5,232,755 | 8/1993 | Komiya et al. | 428/36.91 |
| 5,236,509 | 8/1993 | Sioshansi et al. | 118/719 |
| 5,264,286 | 11/1993 | Ando et al. | 428/432 |
| 5,302,208 | 4/1994 | Grimm et al. | 118/718 |
| 5,340,621 | 8/1994 | Matsumoto et al. | |
| 5,364,667 | 11/1994 | Rhieu | |
| 5,411,591 | 5/1995 | Izu et al. | 118/718 |
| 5,508,075 | 4/1996 | Roulin et al. | |
| 5,529,631 | 6/1996 | Yoshikawa et al. | 118/718 |
| 5,531,060 | 7/1996 | Fayet et al. | 53/426 |
| 5,571,749 | 11/1996 | Matsuda et al. | 437/113 |

APPARATUS AND METHOD FOR MANUFACTURING A PACKAGING MATERIAL USING GASEOUS PHASE ATMOSPHERIC PHOTO CHEMICAL VAPOR DEPOSITION TO APPLY A BARRIER LAYER TO A MOVING WEB SUBSTRATE

FIELD OF THE INVENTION

The present invention relates to an apparatus and method for manufacturing a packaging material that incorporates a barrier layer. More specifically, the present invention relates to an apparatus and method for manufacturing a packaging material using gaseous phase atmospheric photo chemical vapor deposition to apply a barrier layer on a moving web substrate.

BACKGROUND OF THE INVENTION

Flexible and non-flexible packages having at least one layer of a polymer material have been used in the packaging industry for a substantial period of time. Non-flexible packages are generally manufactured from a laminate material that includes a paperboard support layer and inner and outer layers of thermoplastic materials that are heat sealable to one another. Flexible packaging materials often do not include a structural support layer (although they may contain a thin substrate layer of, for example, paper) and are often used to form pouch-type containers. Packages made from these laminated materials have the requisite properties for packaging non-aromatic foodstuffs that are generally insensitive to oxygen but are not suitable for aromatic, oxygen-sensitive foodstuffs, such as orange juice or the like.

Packages for aromatic, oxygen sensitive foodstuffs are generally made from laminated materials incorporating a barrier layer, either as a product contact layer or as an intermediate layer in a multilayer laminate. One of the most commonly used barrier layer materials is aluminum. Another commonly used barrier material is ethylene vinyl alcohol (EVOH).

Other materials have been found to exhibit excellent barrier properties. One set of materials that has been shown to exhibit excellent barrier properties is the silicon based materials. These materials include silicon oxides (SiOx) such as silicon dioxide ($SiO_2$) and silicon nitride ($Si_3N_4$). Packaging materials incorporating such silicon based materials are set forth in U.S. Pat. No. 5,122,410, issued Jun. 16, 1992, to Löfgren, the teachings of which are hereby incorporated by reference. Generally stated, the '410 patent discloses a laminate material comprising a carrier layer of thermoplastic material and a barrier layer of inorganic material that is joined to a further carrier/barrier layer at the faces of the barrier layers by a bonding agent. In one embodiment, the barrier layers are silicon based layers, each having a thickness of 50–500 Å. In the illustrated embodiments, the silicon based barrier layers are deposited on the respective thermoplastic carrier layers using a vacuum deposition process.

The existing vacuum deposition processes used in the manufacture of the multilayer barrier materials are prohibitively costly due to the equipment, time, and energy needs associated with batch processing the materials in a chamber that has been evacuated to a pressure that is substantially below atmospheric pressure. One such process that has been utilized to deposit SiOx materials onto a web in a batch process is a plasma-enhanced chemical vapor deposition (PECVD) process described in U.S. Pat. No. 5,224,441. Other CVD processes are shown, for example, in U.S. Pat. Nos. 4,495,218 to Azuma et al.; 5,364,667, to Rheiu. These processes tend to be prohibitively costly and have generally not been economical for the production of packaging laminate materials.

SUMMARY OF THE INVENTION

An economical apparatus and method for depositing a barrier layer on a substrate material is set forth which eliminates many of the problems associated with prior processes. In accordance with the method of the present invention, a continuous web of substrate material is provided on which the barrier layer is to be deposited. The web of substrate material is driven, either continuously or in an indexed fashion, through a reaction chamber of a deposition apparatus wherein there is provided a flow of precursor gas and oxidizer gas. The reaction chamber has an internal pressure of about one atmosphere. The continuous web of substrate material, the precursor gas, and the oxidizer gas are exposed to ultraviolet radiation in the reaction chamber as the continuous web of substrate material is driven therethrough to thereby provide a barrier layer on the web of substrate material. In accordance with one embodiment of the method, the precursor is a silicon precursor and the barrier layer is a silicon-based barrier layer. The method allows a continuous web of substrate material to be continuously processed at a reaction pressure of about one atmosphere thereby making the production of the resulting packaging material more economical than the batch processing at low pressure that is required of the prior processes.

An apparatus for implementing the method of the invention is also set forth. The apparatus comprises a web dispenser supporting a continuous web of substrate material and a deposition apparatus. The deposition apparatus comprises a) a reaction chamber; b) a web inlet portion for accepting the continuous web of substrate material from the web dispenser into the reaction chamber; c) an ultraviolet energy source disposed to radiate ultraviolet energy into the reaction chamber; d) at least one gas inlet for conducting a flow of a precursor gas, an oxidizing gas, and a carrier gas into said reaction chamber, pressure within the reaction chamber being about one atmosphere, the precursor gas, oxidizing gas, and continuous web of substrate material being exposed to the ultraviolet light energy from the ultraviolet lamp to thereby cause deposition of a barrier layer on the web of substrate material; e) a web outlet portion for allowing passage of the continuous web of substrate material from the reaction chamber; and f) a gas outlet for allowing gases to exit the reaction chamber. The apparatus further comprises a web driving mechanism for driving the web of substrate material through the reaction chamber.

In accordance with further enhancements to the apparatus and method of the present invention, the temperature of the moving web of substrate material is controlled, at least in part, by passing the web over a cooling table as it is processed in the reaction chamber. Additionally, the precursor, oxidizer, ultraviolet light intensity, substrate material, and web speed through the reaction chamber may be chosen so that the deposition of the barrier layer takes place at a temperature of less than about 200° C. within the reaction chamber. Selective deposition of the barrier material may take place using photo masking techniques.

The foregoing apparatus can be used in any one of a variety of system configurations. For example, the foregoing apparatus can be used in a modular fashion to better regulate the thickness of the barrier layer deposited on the substrate.

To this end, a plurality of deposition device modules may be arranged so that the continuous web of substrate material is passed through a series of the devices, each device contributing to a predetermined thickness of the barrier layer material. Additionally, the apparatus can be utilized in a first web converting system wherein the barrier layer is, for example, the product contact layer of the packaging material or in a second web converting system wherein a further material layer is joined on or over the barrier layer of the substrate/barrier material after processing by the deposition apparatus. In either instance, the resulting laminate material may be taken up onto a rewinder roll for transport and use in subsequent converting or packaging operations. In accordance with a still further system utilizing the foregoing apparatus, the apparatus is disposed at the input of a packaging machine wherein the resulting substrate/barrier material is transported after the deposition of the barrier layer to the input of the packaging machine for forming the material into a package which is both filled and sealed.

Other objects, features, and advantages of the present method and apparatus will become apparent on review of the following drawings and accompanying description.

DETAILED DESCRIPTION OF THE PREFERRED EMBODIMENTS

Figure 1:
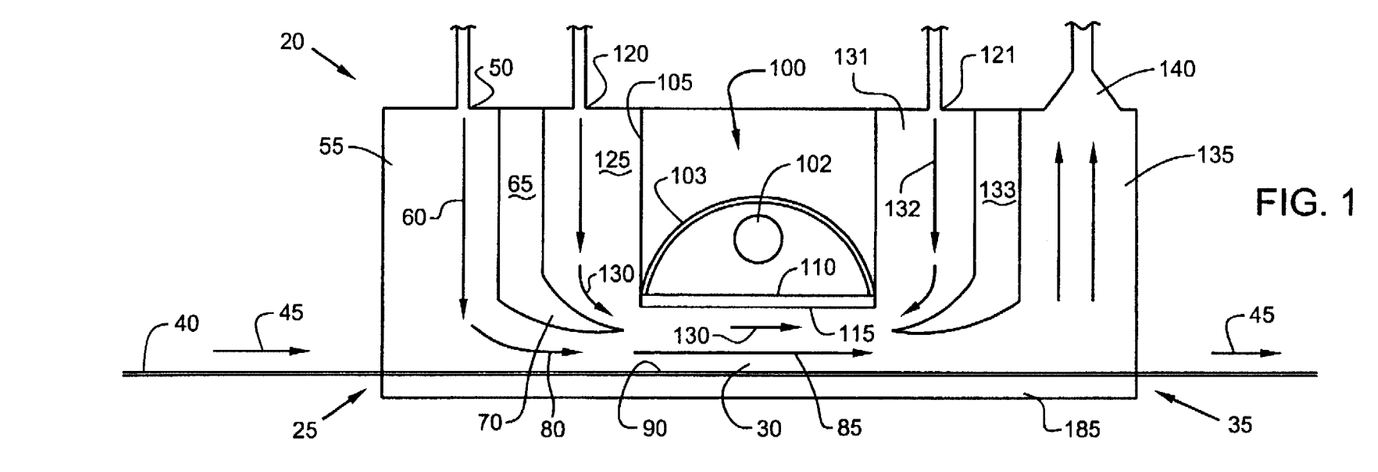
FIG. 1 is a schematic cross-section of a deposition device constructed in accordance with one embodiment of the present invention.

With reference to FIG. 1, there is shown a deposition device 20 constructed in accordance with one embodiment of the present invention. The deposition device 20 includes a web inlet portion 25, a reaction chamber 30, and a web outlet portion 35. A continuous web of substrate material 40 extends from a location exterior to the web inlet portion 25, through reaction chamber 30, to a location exterior to the web outlet portion 35. The continuous web substrate 40 is driven in the direction illustrated by arrows 45 in a continuous manner or in an indexed fashion so as to enter the deposition device 20 at the web inlet portion 25, enter the reaction chamber 30, and exit the deposition device 20 at the web outlet portion 35. The continuous web of substrate material 40 may be a single polymer, such as polyethylene (LDPE, VLDPE, LLDPE, etc.), polyethylene terephthalet (PET), etc., or a multilayer laminate, for example, a paperboard based material coated with at least one layer of polyethylene. Numerous polymers and polymer layer combinations are suitable for use as the web substrate 40. A known surface treatment, such as corona or flame treatment, may be performed on the web substrate 40 prior to processing within the deposition device 20.

A barrier material is deposited on the continuous web of substrate material 40 as it passes through the reaction chamber 30. To this end, a precursor gas, oxidizing gas, and carrier gas are supplied at a first gas inlet 50. These gasses are directed through region 55 in the direction indicated by arrow 60 under the guidance of baffle wall 65. Baffle wall 65 terminates in a curved section 70 at an open region where the gasses are deflected in a direction indicated by arrows 80 and 85 over the upper surface 90 of the web 40. The gasses entering the reaction chamber 30 may be heated, for example, in a manner that will be described below. Although the precursor, oxidizing, and carrier gasses are illustrated as entering the reaction chamber 30 through a single inlet 50, it will be recognized that multiple inlets may be used for communication of these gasses to the reaction chamber 30.

An ultraviolet radiation module, shown generally at 100, is disposed to irradiate the web of substrate material 40 and the oxidizing and precursor gasses so as to result in the deposition of a barrier layer onto the upper surface 90 of the web substrate 40. In the illustrated embodiment, the ultraviolet radiation module 100 includes one or more ultraviolet lamps 102 disposed beneath a reflector hood 103 within a housing 105. Cooling ports (not illustrated) may be used to conduct a cooled air flow through region to cool the reflector hood 103 and UV lamp 102. An ultraviolet transparent window 110 is disposed at one end of the housing 105 proximate the upper surface 90 of the web substrate 40. One type of ultraviolet lamp that may be utilized is a model EPIQ 6000 lamp available from FUSION UV Curing Systems of Rockville, Md. Such a lamp has a generally broad spectrum extending from 200 nm to 450 nm and has a power output of about 600 Watts/inch. Another type of lamp suitable for use in the present system is an excimer (KrCl) lamp such as one sold by Hereus Noblelight. Such an excimer lamp is characterized by a narrow wavelength centered, for example, at 222 nm and has a power output of about 170 Watts/inch. The choice of ultraviolet lamp type is principally determined by the absorption spectrum of the precursor and oxidizing gas molecules that have to react with one another and, further, by the absorption spectrum of the web of substrate material 40.

The precursor and oxidizing gasses react with one another under the influence of the ultraviolet radiation emanating through the window 110. The reactions, however, also take place at the window surface 115 as well as at the upper surface 90 of the web 40. To reduce the deposition of the barrier material on the window surface 115, a further flow of carrier gas is introduced through a second gas inlet 120 and an optional third gas inlet 121. This flow of carrier gas is directed through region 125 and is separated from the precursor/oxidizing/carrier gas stream in region 55 by the baffle wall 65. In the illustrated embodiment, the curved portion 70 assists in directing the carrier gas from region 125 in a direction, illustrated here by arrows 130, across window surface 115 to purge the precursor and oxidizing reactants from the region adjacent the window surface 115. A further flow of carrier gas is directed through inlet 121 and into region 131 in the direction of arrows 132 where it is directed to the window surface 115 by further baffle 133 to further assist in separating the flow 85 of the precursor and oxidizing gasses from the flow 130 of the carrier gas. The carrier gas, residual gas, and byproduct gasses ultimately flow into region 135 where they are removed through exhaust outlet 140, for example, to be released into the atmosphere, to be stored in a containment vessel, to be separated and recycled, etc.

Figure 2A:
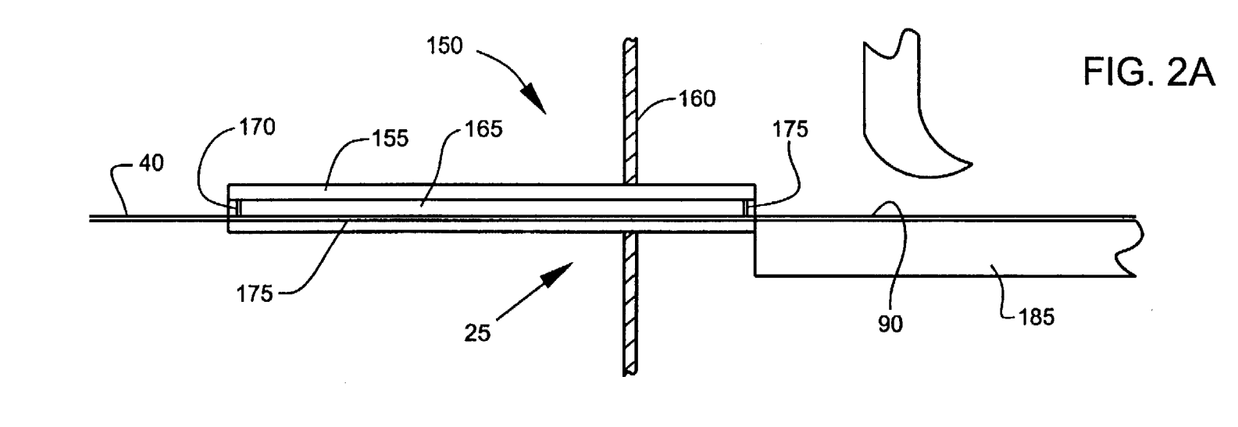
FIG. 2A is a cross-section side view of one embodiment of a web inlet suitable for use in the deposition device of FIG. 1.

The pressure within the reaction chamber 30 will typically be about one atmosphere and, preferably, slightly greater than one atmosphere. As such, it is necessary to ensure as tight a seal as possible at the web inlet and outlet portions 25 and 35 while still allowing the web of substrate material 40 to readily pass therethrough. To accomplish this, the inlet and outlet portions 25 and 35 may be provided with a web sealing device 150, such as shown in FIG. 2A. The web sealing device 150, shown here at the inlet portion 25, includes a channel guide member 155 that extends through a sidewall 160 of the reaction chamber module 20. The channel guide member 155 is elongated in the direction of web movement and defines a channel region 165 through which the web 40 passes. Flexible sealing members 170 and 175 are disposed at opposite ends of the channel region 165 and, for example, may be integrally formed with the channel guide member 155. The flexible sealing members 170 and 175 may be of sufficient length to contact the upper surface 90 of the web 40 and urge the web 40 against a lower wall 175 of the channel region 165. In this manner, the web 35 passes through a generally sealed antechamber (or in the case of a web sealing device at the web exit portion 55, a generally sealed post-chamber) which assists in isolating the reactant and carrier gasses within the reaction chamber 50 from the atmospheric gases. Such a partial seal also increases the integrity of the barrier layer by reducing the possibility of the entry of contaminants into the reaction chamber 30.

Figure 2B:
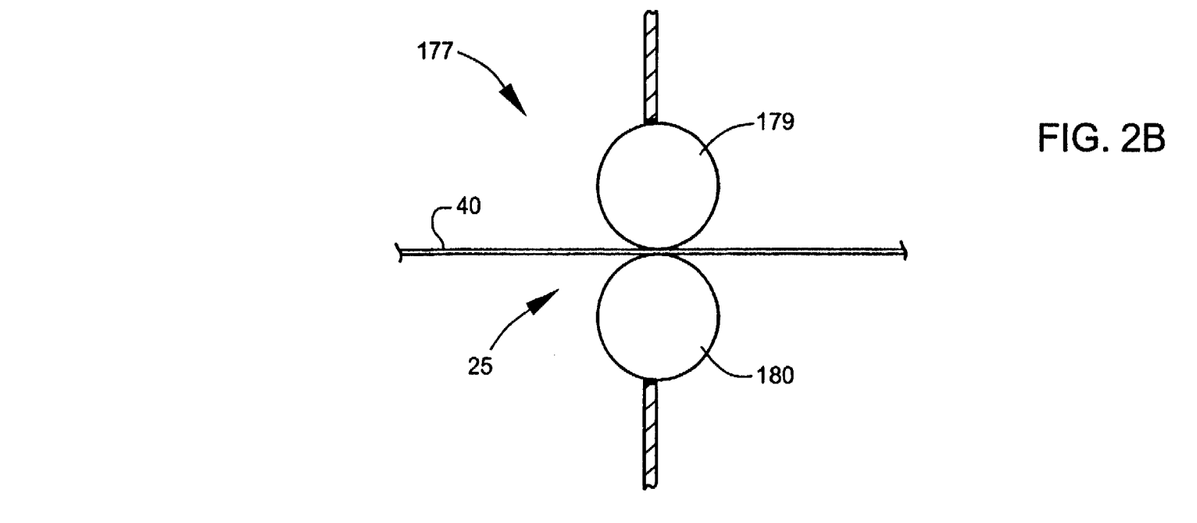
FIG. 2B is a cross-section side view of a further web inlet suitable for use in the deposition device of FIG. 1.

Another web sealing device is shown in FIG. 2B. As illustrated, the web sealing device 177 is disposed through sidewall 160 of the deposition device 20 and includes an upper roller 179 and a lower roller 180 that extend along at least the width of the web 40. The web 40 proceeds between the rollers 179 and 180 and into the interior of the deposition device 20. The edge portions of the sidewall 160 may be provided with gaskets to further seal the interior of the deposition device 20 from external contaminants.

With reference again to FIG. 1, it is possible to select a precursor gas, oxidizing gas, web material, and web speed that allows the deposition of the barrier material to take place in the reaction chamber 30 at temperatures about or below 200° C. Depending on the material(s) used for the web substrate 40, such temperatures may cause one or more layers of the web substrate 40 to go to a molten state. To prevent this from occurring, and to facilitate deposition of the barrier material on the upper surface 90 of the web 40, a cooling table 185 is provided over which the web substrate 40 is transported as it passes through the reaction chamber 30. The cooling table 185 functions as a heat sink for the web 40 and, for example, may be cooled by water tubes or the like extending throughout its interior. Other cooling mechanisms may likewise be employed to cool the cooling table 185 and/or the web substrate 40.

Figure 3:
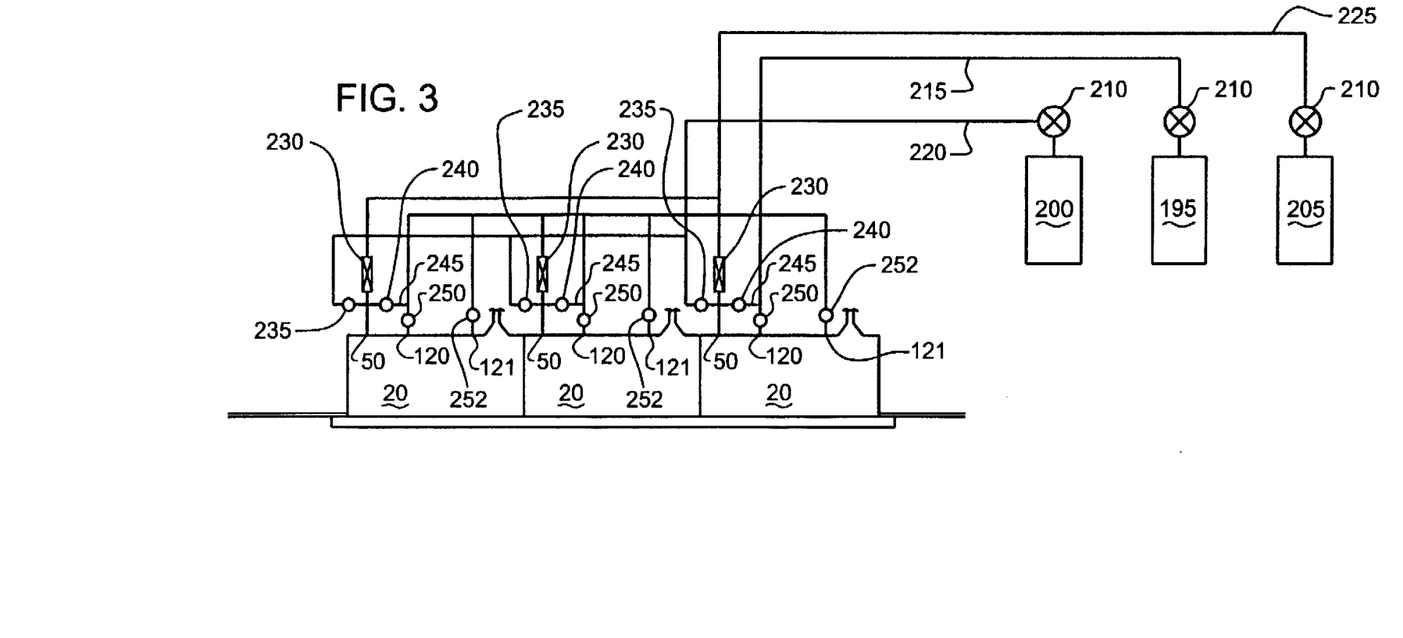
FIG. 3 is a system diagram illustrating the use of a plurality of serially disposed deposition devices of the general type shown in FIG. 1.

FIG. 3 illustrates a modular approach to utilizing the deposition device 20 of FIG. 1 in a system. In the modular system shown in FIG. 2, a plurality of deposition devices 20 are arranged in a serial fashion along the direction of travel of the web substrate 40. The deposition devices 20 are connected to a common carrier gas source 195, an oxidizing gas source 200, and a precursor gas source 205 which includes a vaporizer for the precursor. Pressure regulating valves 210 are disposed between each of the sources 195, 200, and 205 and their respective common lines 215, 220, and 225. A mass flow controller 230 is disposed between the first gas inlet 50 of each deposition device 20 and the common line 225 carrying the precursor gas. Flowmeters 235 are disposed in the oxidizing gas line 220 to monitor flow of the oxidizing gas to the first gas inlet 50 of each of the deposition devices 20. Flowmeters 240 are also disposed in each interconnect line 245 that connects the line 215 supplying carrier gas to the first gas inlet 50. Similarly, flowmeters 250 are disposed in line with the second gas inlet 120 to monitor the flow of carrier gas that is used for purging of the window surface 115 (FIG. 1). Flowmeters 252 may also be used to monitor carrier gas flow at inlet 121. Flowmeter information may be in a digital format suitable for monitoring by a central controller. Similarly, the mass flow controllers 230 may be of the type that may be digitally controlled monitored by a central controller.

Using the deposition devices 20 in a tandem fashion gives rise to several advantages over the use of a single deposition device. For example, the tandem deposition devices can provide more accurate control of the thickness of the barrier layer since a single barrier layer may be deposited on the web substrate 40 by depositing a series of thinner layers whose thickness are easier to control. Additionally, the speed of the web substrate 40 through the deposition devices 20 for a given barrier layer thickness may be increased for large scale production. Also, the modular set-up facilitates quick and economical adaptation of the production line to accommodate for the production of different packaging materials having different substrate/barrier characteristics. Further, the process parameters (flows, gas types, irradiation, etc.) may be different from one module to the next thereby providing a greater degree of flexibility in forming a multilayer structure coating.

Figure 4:
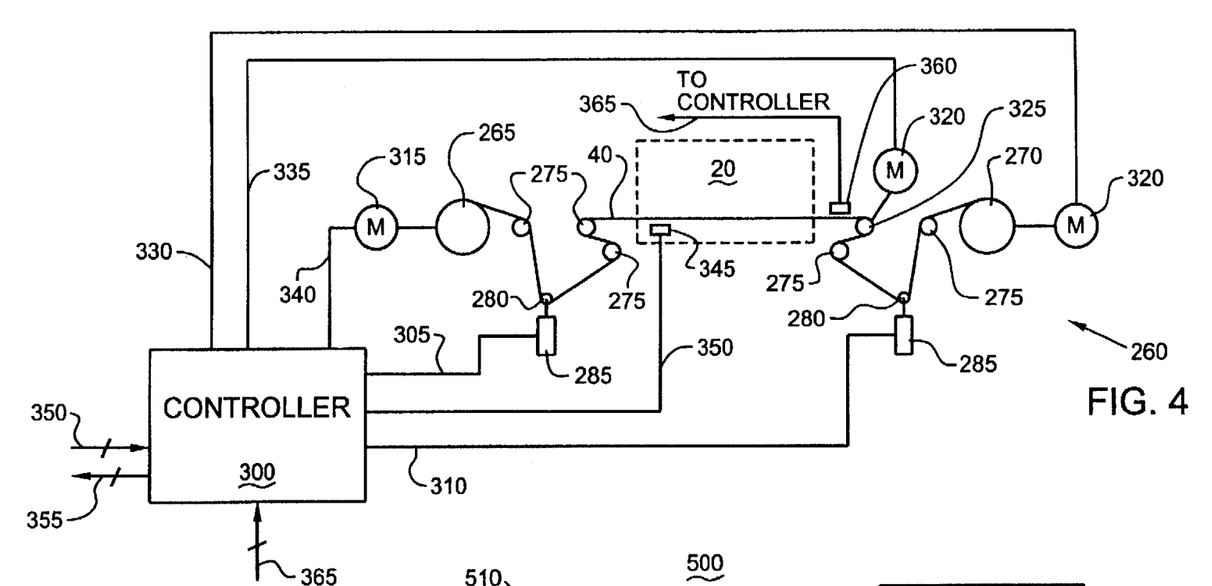
FIG. 4 is a system diagram illustrating one embodiment of a web handling system for use with a deposition device such as the one set forth in FIG. 1.

Various web handling systems are suitable for driving the web substrate through 5 one or more deposition devices. One such system suitable for initial material production or converting operations is shown in FIG. 4. As illustrated, the system, shown generally at 260, includes a web dispenser 265 and web recoil roll 270. The web of substrate material 40 extends between the web dispenser 265 and web recoil roll 270 and through the deposition device 20 in the illustrated manner over a plurality of idler rollers 275 and dancer rollers 280. Each dancer roller 280 is connected to a tension cylinder 285 that assists in adjusting the tension of the web substrate 40 as it passes through the deposition device 20.

The web handling system 260 may be controlled by a central controller 300 which, for example, includes one or both a programmable logic controller, a programmable axis manager, or other type of controller capable of controlling an electric motor, such as a servomotor. The controller 300 receives position information along one or more lines 305 and 310 indicative of the position of dancer rollers 280. This information is used by the controller 300 to control the speed of motors 315 and 320 (i.e., servomotors) which are connected to drive the web dispenser 265 and web recoil roll 270, respectively, and motor 320 which is connected to output drive roller 325. The controller 300 effects control by sending signals along lines 330, 335, and 340, to maintain the speed of the web 40 through device 20 at the desired rate while further maintaining the tension of web 40 at the requisite tension. Tension of the web 40 may also be monitored using a tension sensor 345 that supplies a signal indicative of tension on the web 40 along one or more lines 350. Web tension should be chosen to ensure that the barrier material does not crack or otherwise create flaws in the barrier material.

The central controller 300 may also be used to monitor and control the flow of gases through the deposition device 20 and the temperature within the reaction chamber. To this end, signals indicative of the flow of the respective gasses through the deposition device 20 are provided to the controller along one or more lines 350. The controller 300 also provides output signals along one or more lines 355 to, for example, mass flow controllers and other flow control valves to automatically regulate the supply of gasses in response to the sensed gas flows. Gas flows may be set to and maintained at a predetermined constant level or dynamically changed in response to barrier layer thickness as monitored, for example, by a barrier thickness sensor 360 that supplies a signal indicative of barrier thickness along one or more lines 365. As will be readily recognized, web speed, tension, temperatures and gas flows will vary depending on the barrier material, substrate material, desired barrier material thickness, etc.

Figure 5:
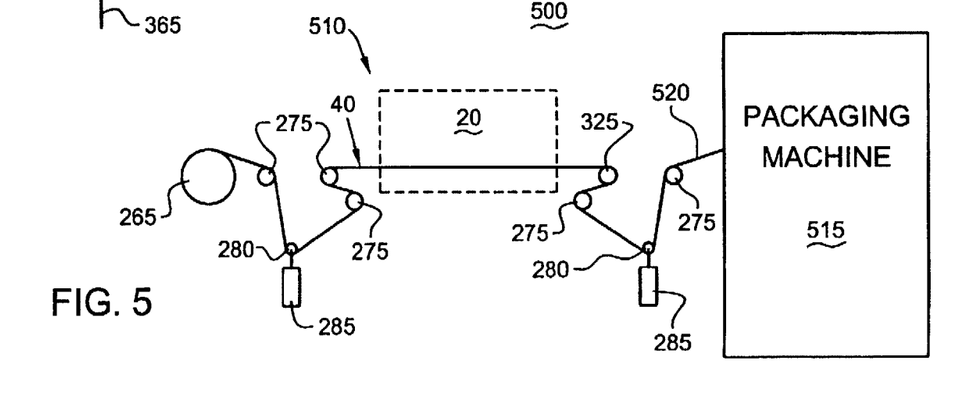
FIG. 5 is a system diagram of a packaging system employing a deposition device and web handling system that feeds a material web directly from the output of a deposition device to the input of a packaging machine.

The use of one or more deposition devices in a single integrated packaging system is illustrated in FIG. 5. The packaging system, shown generally at 500, includes a deposition subsystem 510 and a packaging machine 515. The deposition subsystem 510 deposits a barrier material layer on the web substrate 40 and provides the substrate/barrier material 520 to the input of the packaging machine 515. The packaging machine 515 may, for example, be a TBA-9™ aseptic packaging machine available from Tetra Pak, Inc. The packaging machine 515 receives the web of substrate/ barrier material 520 and forms the material into a container, for example, a brik-type container, that is filled and sealed. Other packaging machine types may also be utilized, the TBA-9® machine being merely exemplary.

Figure 6:
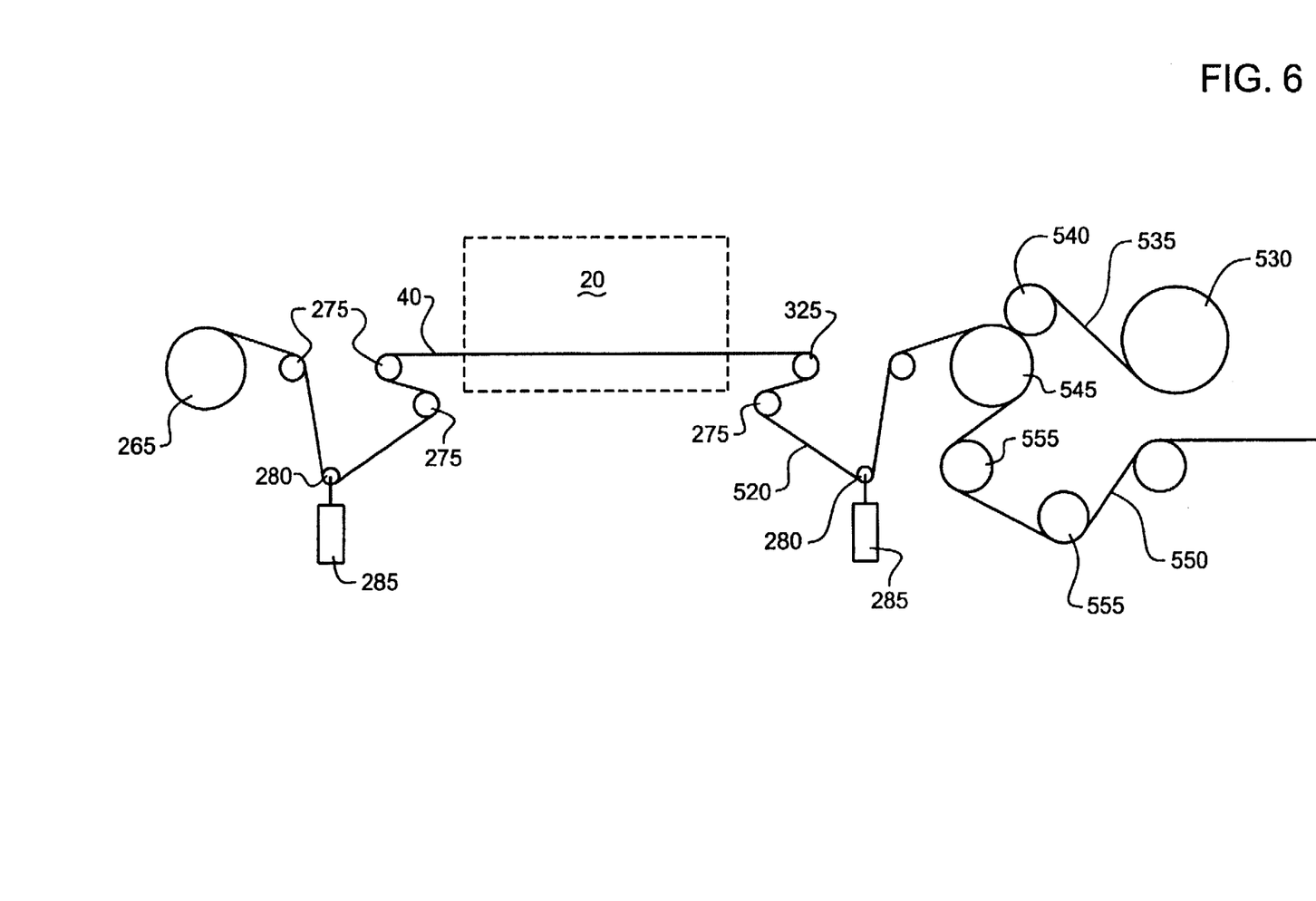
FIG. 6 is a system diagram illustrating one embodiment of a system wherein a further web of material is applied over the barrier layer of the substrate/barrier material exiting the deposition device using adhesive lamination.
Figure 7:
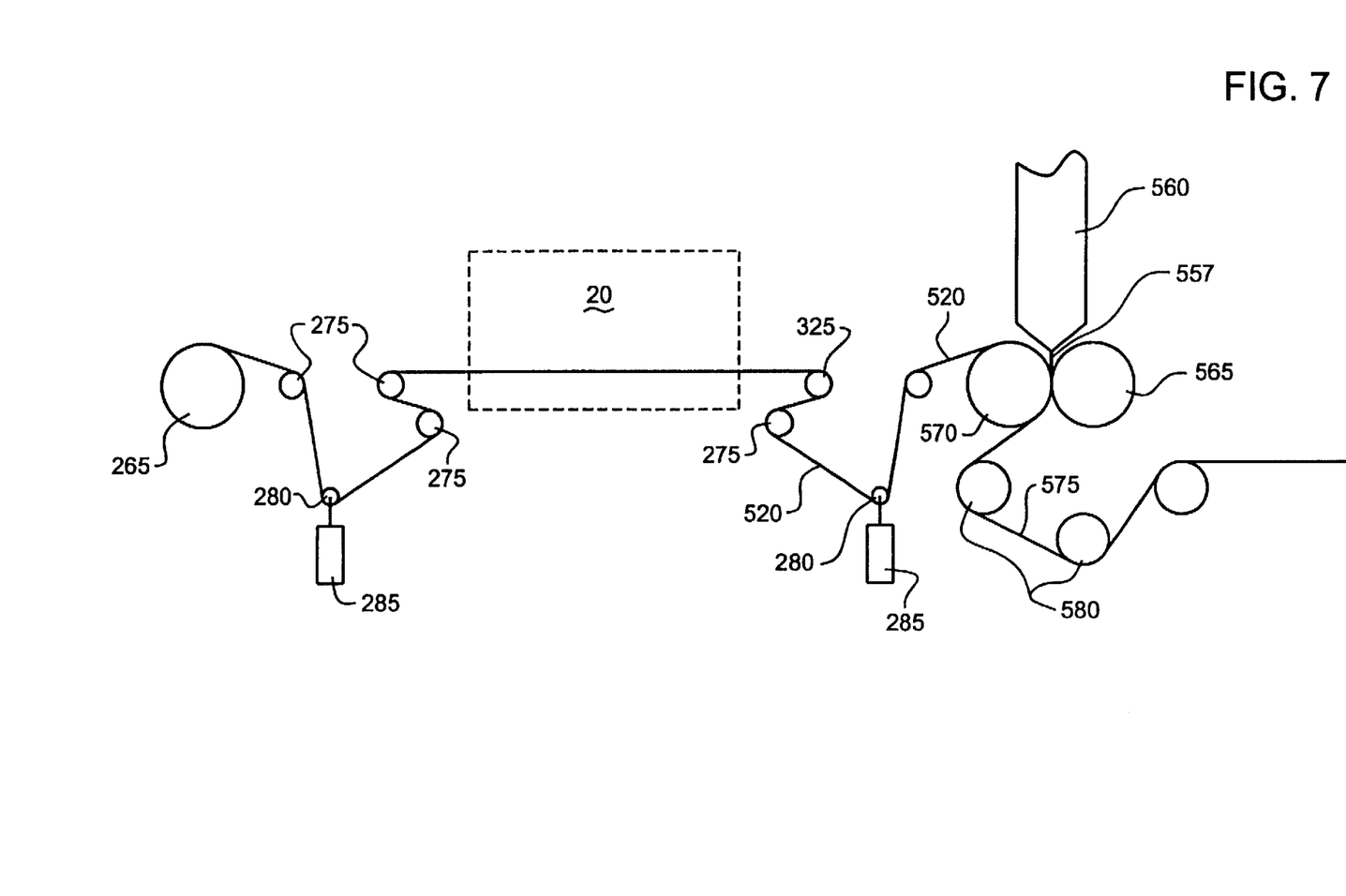
FIG. 7 is a system diagram illustrating one embodiment of a system wherein a further layer of material is extruded over the barrier layer of the substrate/barrier material exiting the deposition device.

The barrier layer of the web substrate/barrier material need not be the product contact layer of any resulting package found from the material. Rather, the substrate/ barrier material 520 may have a further material joined to it at the face of the barrier layer. FIGS. 6 and 7 illustrate two mechanisms that may be used to join the substrate/barrier material 520 to a further material. In the apparatus of FIG. 6, a web of, for example, a multilayer material (e.g., paperboard and polymer, multi-layer polymer, etc.) or single polymer material 535 proceeds from a web dispenser 530 and is laminated to the substrate/barrier material 520 as the substrate/barrier material 520 and material 535 pass between a lay-on rollers 540 and a heating and combining drum 545. An adhesive material may be applied to one or both of the materials 520 and 535 in a known fashion. A known surface treatment, such as corona or flame treatment, may also be utilized to enhance adhesion between the material surfaces. The resulting laminate packaging material 550 is directed over a plurality of heated rollers 555 to, for example, a recoil roll or a packaging machine.

In the apparatus of FIG. 7, a polymer material 557 is extruded through an extruder 560 onto the barrier layer of the substrate/barrier material 520 in a known manner as it passes between a rubber roller 565 and a pinch roller 570. A known surface treatment, such as corona or flame treatment, may be utilized to enhance adhesion between the material surfaces. The resulting laminate packaging material 575 is directed over a plurality of cooling rollers 580 to, for example, a recoil roll or a packaging machine.

Figure 8:
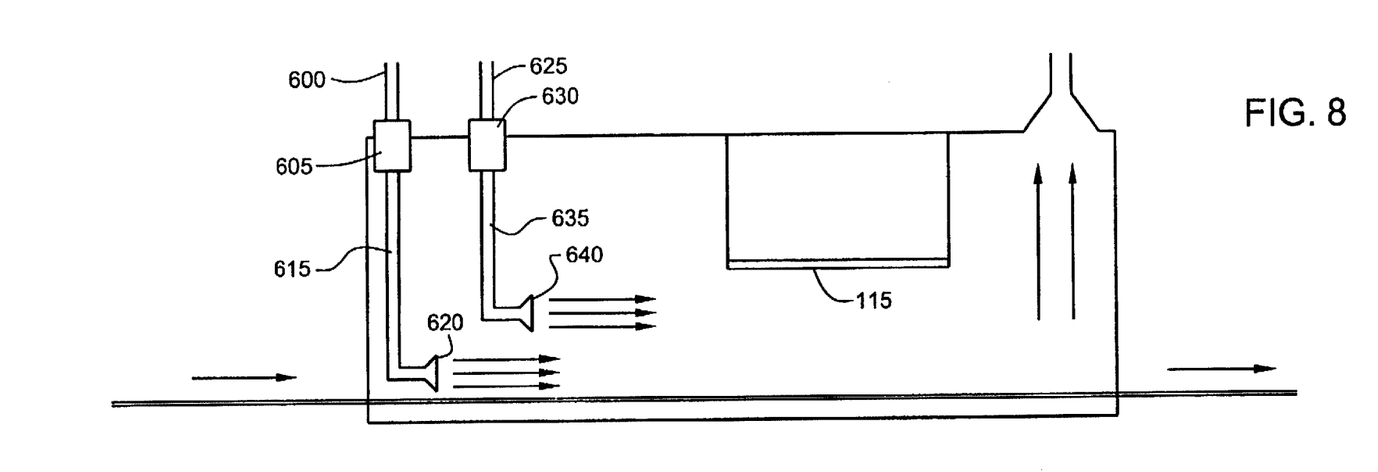
FIGS. 8 and 9 are schematic cross-sections illustrating a further embodiment of the deposition device of the present invention.
Figure 9:
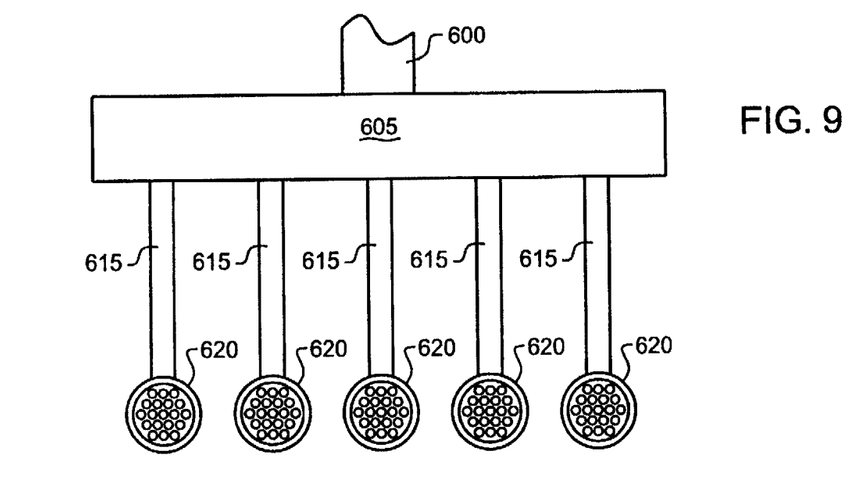

FIGS. 8 and 9 illustrate a further embodiment of the deposition device 20. This embodiment principally differs from embodiment of FIG. 1 in the manner of delivering the precursor, oxidizing, and carrier gasses to the reaction chamber 30. In the illustrated embodiment, a mixture of precursor gas, oxidizing gas, and carrier gas is supplied through an inlet pipe 600 to a manifold 605. A plurality of outlet pipes 615 first extend downward from the manifold 605 and then in a direction that is generally parallel to the web of substrate material 40. Each of the outlet pipes 615 of the plurality of outlet pipes terminates in a diffuser 620 that, for example, may include a heating element for heating the gas mixture as it enters the reaction chamber 30. A similar arrangement including inlet pipe 625, manifold 630, outlet pipes 635, and diffusers 640 are utilized to supply the purging flow of carrier gas over the window surface 115. The outlet pipes 635 for the purging flow of carrier gas do not extend as far downward as the outlet pipes 615 carrying the gas mixture so as to assist in keeping the flow of the gas mixture and the flow of purging carrier gas separate.

Figure 10:
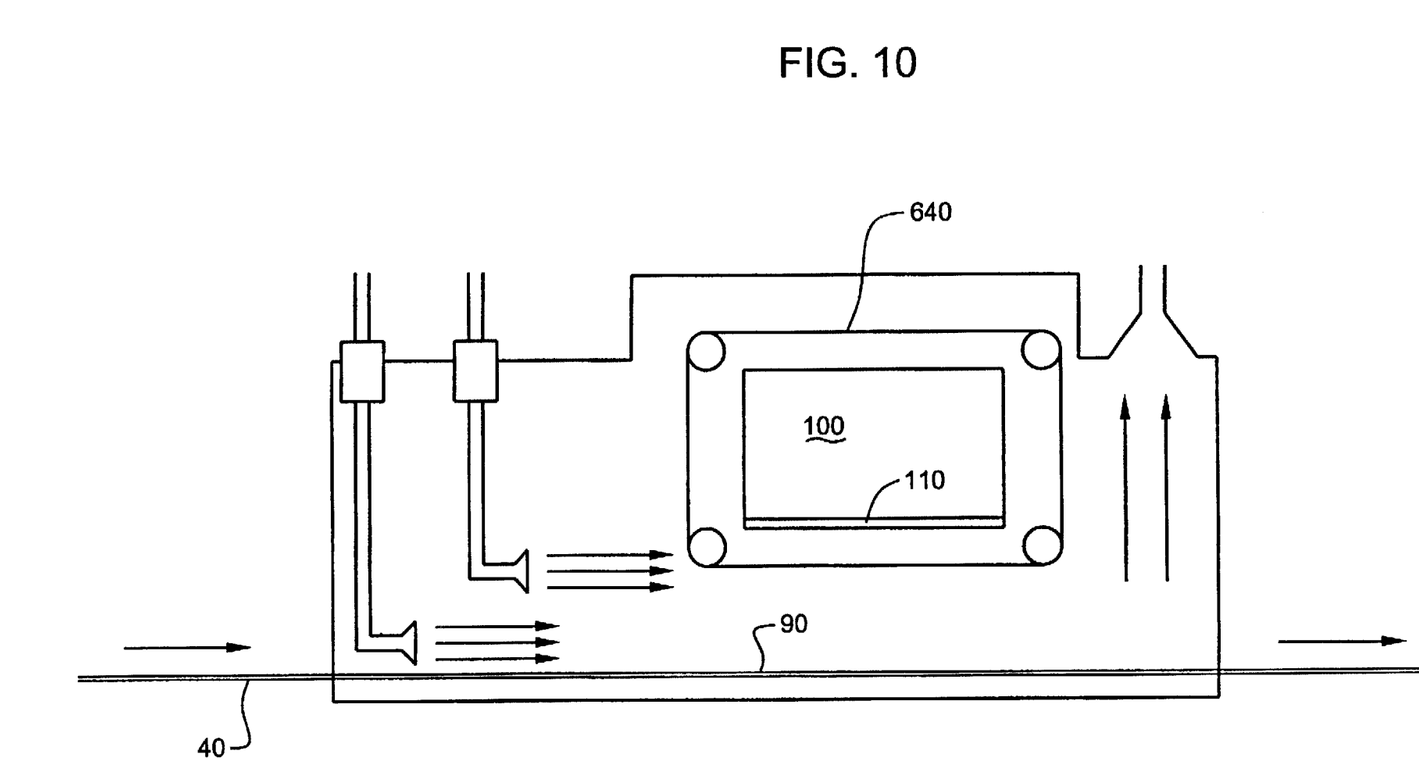
FIG. 10 is a schematic cross-section of a deposition device of the type shown in FIGS. 8 and 9 and further including a masking apparatus.

In accordance with one modification to the deposition device 20 of FIGS. 1 and 8, the device of FIG. 10 is provided with an endless belt mask 640 which facilitates selective exposure of the upper surface 90 of the web substrate 40 to ultraviolet 5 radiation. The endless belt mask 640 is driven, for example, by one or more drive rollers 645 at the same speed as the web of substrate material 40 and includes a repeating pattern which only allows the ultraviolet radiation from the ultraviolet energy module 100 to irradiate selected areas of the web substrate 40. In this manner, only selected portions of upper surface 90 of web substrate 40 have the barrier layer deposited thereon. Selective deposition is particularly desirable when the barrier layer is to be the product contact layer of a package formed from the substrate/barrier material. The portions of upper surface 90 that do not have the barrier material deposited thereon can be used to provide a heat sealing surface to facilitate front-to-back and back-to-back heat sealing of the substrate/barrier material.

An alternative selective deposition construction may be used if the web of substrate material 40 is driven through the deposition device 20 in an indexed manner. In such instance, a mask may be fixed between the UV energy source and the web of substrate material 40, for example, on the window 110. The ultraviolet energy source may then be gated on during the time in which the web dwells beneath the ultraviolet source and gated off as the web is moved.

Figure 11:
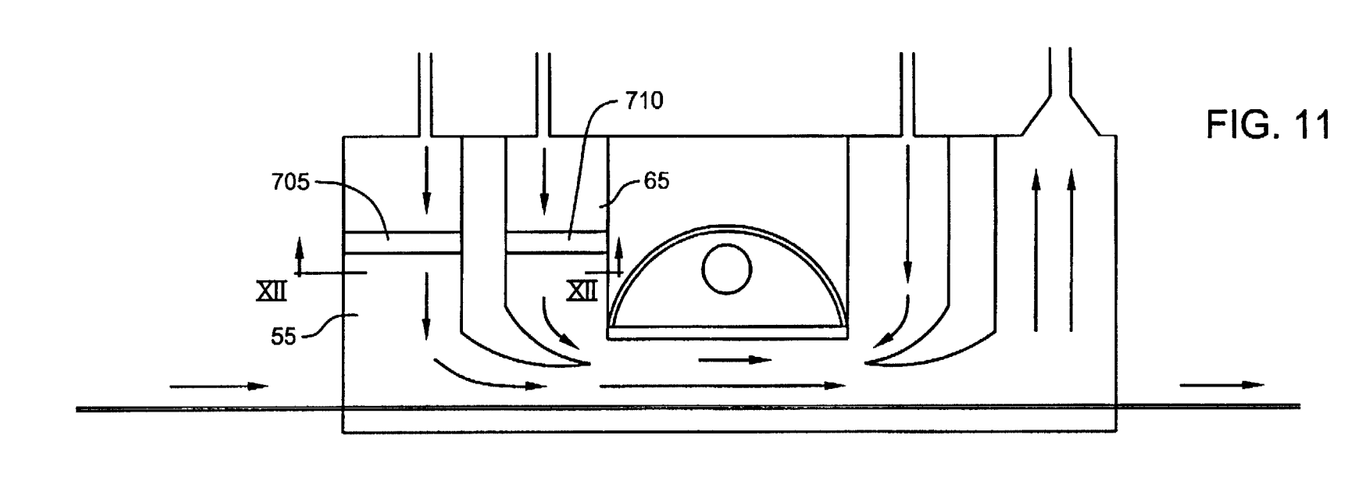
FIGS. 11 and 12 illustrate one embodiment of a heating apparatus which heats the reaction chamber to a desired, reaction temperature.
Figure 12:
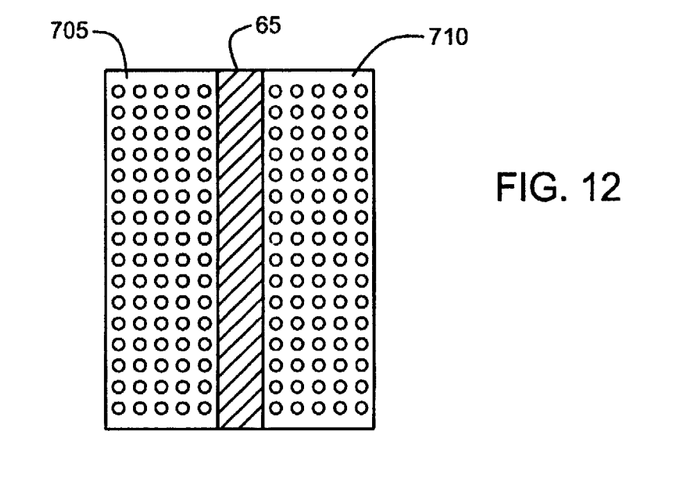

As previously described, the gasses flowing into the reaction chamber 30 may be heated. One manner of heating the gasses to the desired temperature is illustrated in FIGS. 11 and 12. In the illustrated embodiment, heated diffusers 705 and 710 are disposed in regions 55 and 125, respectively, and extend along the entire width of the respective chamber. A diffuser may also be disposed in region 131 in a similar fashion. The diffusers may be heated by passing an electric current therethrough or in any other known manner.

If a barrier layer of SiOx material is desired to be deposited on the web of substrate material 40, the precursor may be an organic silane such as tetraethoxysilane (TEOS).

triethoxysilane, tetraacetoxysilane, or a siloxane such as hexamethyldisiloxane (HMDSO). Other silicon precursors may also be utilized, although organic silanes and organic siloxanes are preferable since they tend to be safer for use in large scale processing. The oxidizing gas may, for example, be an oxidizer such as $N_2O$ or $O_2$. The carrier gas may be an inert gas such as $N_2$, Ar, or He.

As previously noted, web speed, gas types, and gas flows are system dependent. In accordance with one system, a 20 nm silicon dioxide barrier layer was deposited on a PET substrate. The PET substrate was 12 μm thick and 30 cm wide. The web speed was set to 30 m/min at a tension of 1 kg and the web was irradiated by three, 1.7 KW excimer lamps having a narrow spectrum at 222 nm. The distance between the window 115 and the surface 90 of the web was set to 1 cm. The reaction gas flows were set to 95 slm of $N_2$, 9.5 slm $N_2O$, and 0.5 slm of HMDSO, through inlet 50. A nitrogen gas flow of 105 slm through inlet 120. The temperature of the precursor gas lines and diffusers 705 and 710 were set to 150° C. and the PET was passed over cooling table 185 which was water cooled to 10° C.

While particular elements, embodiments and applications of the present invention have been shown and described, it will be understood, of course, that the invention is not limited thereto since modifications may be made by those skilled in the art, particularly in light of the foregoing teachings. It is therefore contemplated by the appended claims to cover such modifications as incorporate those features which come within the spirit and scope of the invention.

What is claimed is:

1. An apparatus for forming a packaging material, the apparatus comprising:
   a) a web dispenser supporting a continuous web of substrate material;
   b) a deposition apparatus comprising
      i. a reaction chamber,
      ii. a web inlet portion for accepting the web of substrate material from the web dispenser into the reaction chamber,
      iii. an ultraviolet radiation source disposed to radiate ultraviolet light energy into the reaction chamber,
      iv. a gas inlet for conducting a flow of a precursor gas, an oxidizing gas, and a carrier gas into the reaction chamber, pressure within the reaction chamber being about one atmosphere, the precursor gas, oxidizing gas, and continuous web of substrate material being exposed to the ultraviolet light energy from the ultraviolet radiation source to thereby cause deposition of a barrier layer on the continuous web of substrate material,
      v. a web outlet portion for allowing passage of the web of substrate material from the reaction chamber, and
      vi. a gas outlet for allowing gases to exit the reaction chamber; and
   c) driving means for driving the continuous web of substrate material through the reaction chamber.

2. An apparatus as claimed in claim 1 wherein the precursor is a silicon precursor and the barrier layer is a silicon-based barrier layer.

3. An apparatus as claimed in claim 2 wherein the precursor is a silane and the barrier layer is an SiOx barrier layer.

4. An apparatus as claimed in claim 3 wherein the precursor is TEOS.

5. An apparatus as claimed in claim 1 wherein the precursor is triethoxysilane.

6. An apparatus as claimed in claim 3 wherein the precursor is tetraacetoxysilane.

7. An apparatus as claimed in claim 2 wherein the precursor is a siloxane and the barrier layer is an SiOx barrier layer.

8. An apparatus as claimed in claim 7 wherein the precursor is HMDSO.

9. An apparatus as claimed in claim 1 wherein the driving means drives the continuous web of substrate material in a continuous manner.

10. An apparatus as claimed in claim 1 wherein the driving means drives the continuous web of substrate material in an indexed manner.

11. An apparatus as claimed in claim 1 wherein the continuous web of substrate material is a multilayer laminate material.

12. An apparatus as claimed in claim 1 wherein the continuous web of substrate material is a paperboard based multilayer laminate material.

13. An apparatus as claimed in claim 12 wherein the temperature in the reaction chamber is maintained at a temperature below about 200° C.

14. An apparatus as claimed in claim 1 wherein the barrier layer serves as both an oxygen barrier and a flavor barrier layer.

15. An apparatus as claimed in claim 1 and further comprising means for heating the reaction chamber.

16. An apparatus as claimed in claim 1 and further comprising a cooling table disposed in the reaction chamber and in contact with the continuous web of substrate material as it passes through the reaction chamber.

17. An apparatus as claimed in claim 1 and further comprising:
   a) a housing for the ultraviolet radiation source; and
   b) a window disposed on the housing for passing ultraviolet radiation therethrough for exposure of the precursor gas, the oxidizing gas, and the continuous web of substrate material.

18. An apparatus as claimed in claim 17 and further comprising means for supplying a purging flow of carrier gas to assist in preventing reaction of the precursor gas and oxidizing gas on a surface of the window.

19. An apparatus as claimed in claim 17 and further comprising means for accepting the continuous web of substrate material from the deposition apparatus and for disposing a further layer of material over the barrier layer.

20. An apparatus as claimed in claim 17 and further comprising a further deposition apparatus disposed to accept the continuous web of substrate material from the web outlet portion of the deposition apparatus.

21. A packaging system comprising:
   a) a web dispenser supporting a web of substrate material;
   b) at least one deposition apparatus comprising
      i. a reaction chamber,
      ii. a web inlet portion for accepting the web of substrate material from the web dispenser into the reaction chamber,
      iii. an ultraviolet energy source disposed to radiate ultraviolet light energy into the reaction chamber,
      iv. a gas inlet for conducting a flow of a precursor gas, an oxidizing gas, and a carrier gas into said reaction chamber, pressure within the reaction chamber being about one atmosphere, the precursor gas, oxidizing gas, and .web of substrate material being exposed to the ultraviolet light energy from the ultraviolet energy source to thereby cause deposition of a barrier layer on the continuous web of substrate material, v. a web outlet portion for allowing passage of the web of substrate material from the reaction chamber, and vi. a gas outlet for allowing gases to exit the reaction chamber; and c) driving means for driving the web of substrate material through the reaction chamber; and d) a packaging machine disposed to receive the web of substrate material from the web outlet portion of the at least one deposition apparatus, the packaging machine using the web of substrate material to form a container that is filled with a product.

22. A packaging system as claimed in claim 21 wherein the precursor is a silicon precursor and the barrier layer is a silicon-based barrier layer.

23. A packaging system as claimed in claim 22 wherein the precursor is a silane and the barrier layer is an SiOx barrier layer.

24. An apparatus as claimed in claim 22 wherein the precursor is triethoxysilane.

25. An apparatus as claimed in claim 22 wherein the precursor is tetraacetoxysilane.

26. A packaging system as claimed in claim 22 wherein the precursor is a siloxane and the barrier layer is an SiOx barrier layer.

27. A packaging system as claimed in claim 26 wherein the precursor is HMDSO.

28. A packaging system as claimed in claim 21 wherein the precursor is TEOS.

29. A packaging system as claimed in claim 21 wherein the driving means drives the continuous web of substrate material in a continuous manner.

30. A packaging system as claimed in claim 21 and further comprising:

a) a housing for the ultraviolet radiation source; and b) a window disposed on the Housing for passing ultraviolet radiation therethrough for exposure of the precursor gas, the oxidizing gas, and the continuous web of substrate material.

31. A packaging system as claimed in claim 30 and further comprising means for supplying a purging flow of carrier gas to assist in preventing reaction of the precursor gas and oxidizing gas on a surface of the window.

32. A packaging system as claimed in claim 21 wherein the driving means drives the continuous web of substrate material in an indexed manner.

33. A packaging system as claimed in claim 21 wherein the packaging machine is an aseptic packaging machine.

34. A packaging system as claimed in claim 33 wherein the packaging machine forms and fills brick-type containers.

35. A packaging system as claimed in claim 21 and further comprising means for applying at least one layer of material to the barrier layer of the continuous web of substrate material.

36. A packaging system as claimed in claim 35 wherein the at least one layer of material is a polymer material.

37. A packaging system as claimed in claim 21 and further comprising laminating means for laminating at least one material layer over the barrier layer of the substrate material.

38. A packaging system as claimed in claim 37 wherein the at least one layer of material is a polymer material.

39. A packaging system as claimed in claim 21 and further comprising extruder means for extrusion coating at least one material layer on the barrier layer of the substrate material.

40. A packaging system as claimed in claim 39 wherein the at least one layer of material is a polymer material.

* * * * *